(12) United States Patent
Hecht et al.

(10) Patent No.: US 7,344,953 B2
(45) Date of Patent: Mar. 18, 2008

(54) PROCESS FOR VERTICALLY PATTERNING SUBSTRATES IN SEMICONDUCTOR PROCESS TECHNOLOGY BY MEANS OF INCONFORMAL DEPOSITION

(75) Inventors: Thomas Hecht, Dresden (DE); Matthias Goldbach, Dresden (DE); Uwe Schröder, Dresden (DE)

(73) Assignee: Infineon Technologies, AG, Neubiberg (DE)

( * ) Notice: Subject to any disclaimer, the term of this patent is extended or adjusted under 35 U.S.C. 154(b) by 312 days.

(21) Appl. No.: 11/042,326

(22) Filed: Jan. 26, 2005

(65) Prior Publication Data

US 2005/0164464 A1    Jul. 28, 2005

Related U.S. Application Data

(63) Continuation of application No. PCT/DE03/02438, filed on Jul. 21, 2003.

(30) Foreign Application Priority Data

Jul. 30, 2002    (DE) ............................... 102 34 735

(51) Int. Cl.
    *H01L 21/20* (2006.01)
(52) U.S. Cl. ...................... 438/386; 438/243; 438/248; 438/388; 438/391; 257/301; 257/E27.092; 257/E29.346; 257/E21.396

(58) Field of Classification Search ................. 438/386
See application file for complete search history.

(56) References Cited

U.S. PATENT DOCUMENTS

| 6,232,171 | B1 | 5/2001 | Mei |
| 6,759,292 | B2* | 7/2004 | Seitz et al. ................. 438/243 |
| 7,160,577 | B2* | 1/2007 | Ahn et al. ............. 427/255.31 |
| 2001/0054769 | A1 | 12/2001 | Raaijmakers et al. |
| 2002/0014647 | A1 | 2/2002 | Seidl et al. |
| 2003/0114018 | A1 | 6/2003 | Gutsche et al. |
| 2003/0181006 | A1* | 9/2003 | Schrems ..................... 438/243 |

* cited by examiner

*Primary Examiner*—Carl Whitehead, Jr.
*Assistant Examiner*—Colleen E. Rodgers
(74) *Attorney, Agent, or Firm*—Edell, Shapiro & Finnan, LLC (57) ABSTRACT

On a substrate surface, which has been patterned in the form of a relief, of a substrate, typically of a semiconductor wafer, a deposition process is used to provide a covering layer on process surfaces which are vertical or inclined with respect to the substrate surface. The covering layer is patterned in a direction which is vertical with respect to the substrate surface by limiting a process quantity of at least one precursor material and/or by temporarily limiting the deposition process, and is formed as a functional layer or mask for subsequent process steps.

30 Claims, 8 Drawing Sheets

PROCESS FOR VERTICALLY PATTERNING SUBSTRATES IN SEMICONDUCTOR PROCESS TECHNOLOGY BY MEANS OF INCONFORMAL DEPOSITION

CROSS REFERENCE TO RELATED APPLICATIONS

This application is a continuation of PCT/DE03/02438, filed Jul. 21, 2003, and titled "Method for the Vertical Structuring of Substrates in Semiconductor Process Technology by Means of Non-Conforming Deposition," which claims priority under 35 U.S.C. §119 to German Application No. DE 102 34 735.2, filed on Jul. 30, 2002, and titled "Method for the Vertical Structuring of Substrates in Semiconductor Process Technology by Means of Non-Conforming Deposition," the entire contents of which are hereby incorporated by reference.

FIELD OF THE INVENTION

The invention relates to a process for patterning process surfaces of a substrate that includes a relief, where the surfaces are vertical and/or inclined with respect to a horizontal substrate surface and extend down to a relief depth with respect to the substrate surface, and where a coverage depth is predetermined between the relief depth and the substrate surface.

BACKGROUND

In semiconductor process technology, planar substrate surfaces which are horizontal with respect to a wafer surface are patterned by photolithographic methods in combination with selective etching processes. During the processing of integrated circuits, reliefs with a pronounced topography are formed on the wafer or substrate surface. A relief of this type also has surfaces which are inclined or vertical with respect to the substrate surface. As part of the ongoing shrinking of the integrated circuits, it is necessary for vertical or inclined process surfaces to be patterned as well, in order for it to be possible to functionally differentiate the structures over their vertical extent. Examples of such structures include deep trench capacitors, stacked capacitors and vertical transistor designs.

It is not directly possible to pattern reliefs in a direction which is vertical with respect to the substrate surface by means of photolithographic methods. Vertical patterning of this nature is usually carried out with the aid of a suitable filler material which, as a mask, covers regions of the relief located beneath a coverage depth during processing of unmasked regions. In this case, patterning of a relief in a direction which is vertical with respect to the substrate surface, with regard to a coverage depth which is selected as desired between a substrate surface and a relief depth, then usually takes place using one of the following methods.

In a first method, where an oxide is to be deposited exclusively in a lower region, arranged between the coverage depth and the relief depth of a relief, in a first step an oxide is deposited or produced over the entire surface of the relief. Then, the relief is initially completely filled with a suitable filling material, and then the filling material is recessed back to the coverage depth. Then, uncovered sections of the oxide are removed, and as the final step residual sections of the filling material are removed altogether.

In a second method where an oxide is to be deposited or produced only in upper regions, arranged between the substrate surface and the coverage depth of a relief, an etching stop layer (e.g., a nitride layer) is first provided over the entire surface of the entire relief. This is then followed by filling of the structure with a suitable filling material (e.g., polycrystalline silicon) and etching back of the filling material as far as the coverage depth. Then, the etching stop layer is removed in the unmasked sections and an oxide is deposited or generated by thermal means in the uncovered regions. Next, the oxide is anisotropically etched. This is followed by removal of the filling material and, as a final step, the complete removal of the etching stop layer.

In addition, plasma-enhanced chemical vapor deposition (PECVD) processes are known. In these processes, thin films, the thickness of which on surfaces which are vertical or inclined with respect to the substrate surface decreases as the depth increases, are produced on surfaces of a relief. However, in this process it is difficult to control the way in which the layers produced end in the depth direction. Furthermore, layers of this type have very considerable differences in thickness between an end point in the depth and a region close to the substrate surface.

Likewise, in the case of diffusion-limited deposition of silicon oxide by means of tetraethyl orthosilicate (TEOS), the silicon oxide grows on surfaces which are inclined or vertical with respect to the substrate surface at a rate which decreases as the relief depth increases, and consequently the layer thickness of the silicon oxide produced in this way decreases in the direction of the relief depth.

Therefore, there have hitherto only been complex processes which allow a covering layer of uniform layer thickness to be arranged or produced exclusively above or below a coverage depth on surfaces of a substrate which are vertical or inclined with respect to the substrate surface.

SUMMARY OF THE INVENTION

Therefore, it is an object of the present invention to provide a process which, in a simple way, allows a covering layer of substantially uniform layer thickness to be provided exclusively above a predetermined coverage depth on process surfaces which are vertical or inclined with respect to a substrate surface of a substrate.

Another object of the invention is to present a process for arranging an oxide layer in a lower or upper trench region of a trench which is formed in a substrate and a process for producing a capacitor structure.

The aforesaid objects are achieved individually and/or in combination, and it is not intended that the present invention be construed as requiring two or more of the objects to be combined unless expressly required by the claims attached hereto.

In accordance with the invention, a process includes vertical patterning of a substrate, where the patterning is vertical and/or inclined with respect to a horizontal substrate surface and has process surfaces that extend down to a relief depth with respect to the substrate surface, and with regard to a coverage depth located in each case between the relief depth and the substrate surface. The process includes producing a covering layer from precursor materials in a process chamber and via a deposition process, restricting the deposition of at least one of the precursor materials compared to deposition of a complete covering layer, so as to result in the covering layer being provided virtually exclusively, and with a substantially uniform layer thickness, on upper sections, arranged between the substrate surface and the coverage depth, of the process surfaces.

DETAILED DESCRIPTION

A process in accordance with the present invention includes patterning of a substrate that is vertical and/or inclined with respect to a horizontal substrate surface and has process surfaces that extend down to a relief depth with respect to the substrate surface, and with regard to a coverage depth located in each case between the relief depth and the substrate surface. The process includes producing a covering layer from precursor materials in a process chamber and via a deposition process, restricting the deposition of at least one of the precursor materials compared to deposition of a complete covering layer, so as to result in the covering layer being provided virtually exclusively, and with a substantially uniform layer thickness, on upper sections, arranged between the substrate surface and the coverage depth, of the process surfaces.

In this process, a deposition process, for example an ALD (atomic layer deposition) process, is used to provide a covering layer of substantially uniform layer thickness between the upper sections of the relief. In this case, process parameters of the deposition process, in particular a deposition time, a quantity of a precursor material which is deposited during the deposition process and/or a chamber pressure in the process chamber are controlled in such a manner that the relief is incompletely covered.

An incomplete, inconformal covering layer (inconformal liner) of this type produced in accordance with the invention covers the relief only above the coverage depth. The covering layer in this case has a substantially uniform layer thickness.

In a first phase of an ALD process, a first precursor material is fed to a process chamber in which the substrate is located. As a result of a process known as chemisorption, the first precursor material accumulates exclusively in intended (activated) sections of the substrate surface. In the process, the first precursor material is generally modified. When all the activated sections have been covered with the modified precursor material, the first process phase of the deposition is complete and a monomolecular partial monolayer comprising a modified precursor material has been deposited on the substrate surface. Then, fractions of the first precursor material which have not been deposited are removed from the process chamber by purging with an inert gas and/or by being pumped out. In a second phase, a second precursor material is introduced into the process chamber and is deposited almost exclusively on the partial monolayer comprising the first precursor material. In the process, the precursor materials are reacted to form the layer material. This leads to the formation of a monolayer of the layer which is to be produced. After removal of undeposited fractions of the second precursor material from the process chamber, a process cycle of the ALD process is complete. The process cycle is repeated until a layer of predetermined layer thickness has been formed from the monolayers deposited each process cycle.

In ALD processes, the self-limiting nature of these processes is customarily exploited, in which context, given a sufficient supply of the precursor materials, a complete covering layer (conformal liner) of virtually uniform layer thickness results irrespective of a quantity of the precursor materials supplied, their incoming flow characteristics and diffusion and reaction dynamics of the precursor materials. Since the deposition of the precursor materials is largely restricted by chemisorption but not by the dynamic, diffusion-defined process, the result of ALD processes is very good edge coverage in the case of deposition on nonplanar patterned substrate surfaces.

It has been possible to observe that the deposition process on a patterned surface, under certain process conditions, takes place in targeted fashion from the substrate surface into the depth of the relief. This fact is exploited by the process according to the invention. In this context, it is essential to the invention that a complete layer of the precursor material results in upper regions of the relief, facing the substrate surface, but scarcely any material is deposited in lower regions. An intervening transition region, in which there is a coverage gradient, is of only a small size compared to the typical relief depth. Targeted, systematic coverage of a relief of this nature from the substrate surface into the depth of the relief preferentially results when at least one of the precursor materials has a low desorption coefficient and is supplied in a reduced quantity compared to a quantity required for complete coverage.

If the precursor material has a low desorption coefficient, the likelihood of a molecule of the precursor material which has already been adsorbed being removed again from the layer, i.e. being desorbed, is very low. If, during an ALD process, a precursor material with a low desorption coefficient, corresponding to a high sticking coefficient, is provided, a relief which has been imparted to a substrate surface is progressively covered from the substrate surface into the depth. The coverage is complete, apart from a short transition region, and forms a uniform layer thickness.

A precondition for this is for the precursor material to be supplied in only a limited quantity, and for the deposition process to be interrupted in good time before complete coverage, and for the chamber pressure in the process chamber to be selected in such a way that sufficiently slow diffusion of the precursor material into the depth of the relief is ensured.

In this way, a substrate surface which includes a relief can be vertically patterned in a particularly advantageous and simple way. If the layer which has been deposited is already a functional layer, there is no need for any masking. On the other hand, the deposited layer may be a mask, in which case at least one etch-back step for patterning of the mask is eliminated compared to conventional processes.

The accuracy with which a predetermined coverage depth can be attained is dependent, for given process parameters, on the total area of the relief on the substrate or wafer surface which is to be covered. The larger the total area which is to be covered, the less the coverage depth is dependent on fluctuations in the quantity of precursor material supplied and/or the duration of deposition of the precursor material. As the density of structures produced on the substrate surface increases to an ever greater extent, the total area to be covered would become larger, since the relief is patterned more finely and densely in the horizontal dimension and functional structures are increasingly produced at vertical surfaces.

A particular advantage of the process according to the invention resides in the fact that the accuracy with which a predetermined coverage depth can be achieved is increased in the same way with the development of integrated circuits as outlined above. With regard to the process parameters, the coverage depth is preferably set as a function of an exposure which results from a product of a quantity or concentration of one of the precursor materials in the process chamber, a deposition time for the precursor material and a process pressure in the process chamber during the deposition.

According to a preferred embodiment of the process according to the invention, during the deposition process at least one of the precursor materials, preferably a precursor material with a high sticking coefficient, is supplied in a lower quantity or concentration than would be required for complete coverage. In each case at least one process phase of a process cycle of the deposition process ends with the consumption of the precursor material which has been cut back. There is advantageously no need to monitor the deposition operation in terms of time. A total area covered by the covering layer produced and therefore the coverage depth are directly related to the quantity of the precursor material made available.

Particularly accurate checking and control of the deposition process results when at least one of the precursor materials is supplied by means of liquid injection. With this method, it is possible to very accurately set the quantity of the precursor material supplied and therefore the coverage depth.

According to a further preferred embodiment of the process according to the invention, the deposition time of at least one precursor material, preferably of a precursor material with a high sticking coefficient, is controlled during in each case one process cycle of the deposition process. In this case, the coverage depth is set by means of the deposition time for the precursor material.

It is preferable to match the process according to the invention to different types of reliefs by means of the chamber pressure in the process chamber during the deposition in particular of the precursor material with a high sticking coefficient. For example, deposition of an inconformal covering layer on a shallow relief which has structures with a low aspect ratio and/or a high proportion of process surfaces inclined with respect to the surface, for the same coverage depth, requires a lower chamber pressure than deposition on a deep relief with structures with a high aspect ratio.

According to a further preferred embodiment of the process according to the invention, a distribution device (e.g., a shower head) which extends over the entire substrate surface is provided for homogeneous distribution of at least the precursor material which has been cut back on over the entire substrate surface. In this way, it is possible to attain a coverage depth which is uniform over an entire wafer surface.

The covering layer may itself be a functional layer. However, it is also possible for a covering layer produced in the manner described above in turn to be used as a mask. Compared to conventional processes for producing a mask for vertical patterning, this eliminates at least one step of etching back and patterning a mask material deposited over the entire surface.

According to one preferred embodiment of the process according to the invention, a material which forms the covering layer is provided as a material with a high etching resistance set against a material which forms lower sections, arranged between the relief depth and the coverage depth, of the process surfaces. The material which forms the process surfaces in the lower sections can then, after deposition of a covering layer, be etched with a high etching selectivity with respect to the covering layer, the etching being masked at least in sections by the covering layer.

According to another preferred embodiment of the process according to the invention, a material which is substantially inert with respect to an oxidation process is provided for the covering layer. Then, the material which forms the process surfaces between the relief depth and the coverage depth is oxidized by means of the oxidation process. The oxidation process is masked at least in sections by the covering layer.

According to yet another preferred embodiment of the process according to the invention, the covering layer is provided as a barrier layer against a doping process. The material which forms the process surfaces between the relief depth and the coverage depth is doped by means of the doping process, the doping process being masked at least in sections by the covering layer. After use as a mask, the covering layer is removed again.

The substrate in which the relief is formed is composed of one or more layers of materials which are customary in semiconductor process technology. Standard layer materials for the substrate are, for example, crystalline, polycrystalline or epitaxially grown silicon or silicon compounds.

Materials which are well suited to inconformal deposition in accordance with the invention have properties which are in some cases disadvantageous for subsequent processing. For example, in the case of HSG forming, HSG structures are also formed to a considerable extent for example on an inconformal covering layer of $Al_2O_3$.

Therefore, prior to the application of the inconformal covering layer, it is preferable to provide an additional layer which is initially masked by the inconformal covering layer. Then, the inconformal covering layer is removed prior to process steps for which the properties of the material of the inconformal covering layer are disadvantageous, and is replaced by the additional layer below it. Silicon oxide and silicon nitride are preferred materials for the additional layer.

Suitable materials for the inconformal covering layer are materials which are functionally suitable for acting either as dielectric or conductive layers or as a mask. These include $Al_2O_3$, $HfO_2$, $ZrO_2$, $TiO_2$, $TiN$, $WN$, $SiN$ and $LaO_2$ and further oxides of rare earths. The deposition is in this case typically carried out in each case at a temperature of between 25° Celsius and 800° Celsius and at a pressure of between 0.13 Pa and 1013 hPa. Depending upon the precursor materials selected, the temperature and pressure ranges should in each case be restricted in a manner which is known for the person skilled in the relevant art.

As has already been described, suitable precursor materials are in particular those that have a high sticking coefficient or a low desorption coefficient. Therefore, for aluminum oxide, it is preferable for trimethylaluminum to be selected as first precursor material and for $H_2O$ and/or $O_3$ to be selected as second precursor.

A further preferred material for the covering layer is hafnium oxide, in which case $HfCl_4$, Hf-t-butoxide, Hf-dimethylamide, Hf-ethylmethylamide, Hf-diethylamide or $Hf(MMP)_4$ is selected as first precursor and $H_2O$ and/or $O_3$ is selected as second precursor.

If zirconium oxide is selected as material for the covering layer, it is preferable for $ZrCl_4$ or an organic Zr compound to be selected as first precursor and for $H_2O$ and/or $O_3$ to be selected as second precursor.

In a further preferred embodiment, titanium oxide is formed as material for the covering layer from the first precursors $TiCl_4$, $Ti(OC_2H_5)_4$ or $Ti(OCH(CH_3)_2)_4$ and the second precursors $H_2O$ and/or $O_3$.

A further preferred material for the covering layer is titanium nitride, which is formed from $TiCl_4$ and from $NH_3$ as precursors.

According to a further preferred embodiment of the process according to the invention, tungsten nitride is formed from the precursor materials $WF_6$ and $NH_3$.

It is also preferable for silicon nitride to be formed as material for the covering layer from the precursors $SiH_2$, $Cl_2$ and $NH_3$ and/or $N_2H_4$.

Furthermore, it is possible for silicon oxide to be selected as material for the covering layer, in which case $Si(NCO)_4$ or $CH_3Osi(NCO)_3$ is used as first precursor and $H_2$ and/or $O_3$ is used as second precursor.

The process according to the invention is in principle suitable for the vertical patterning of various types of reliefs. However, it is particularly suitable for the patterning of trenches which have been formed with a high aspect ratio in a substrate. Particularly in trenches with a high aspect ratio, the arrangement of the precursor material which has been cut back on is determined by diffusion in a pronounced systematic manner from the substrate surface.

In a particularly preferred embodiment of the process according to the invention, the trenches are functionally formed into capacitors. If the capacitors have a dielectric collar which ends approximately at the height of the coverage depth around the trench, the collar can serve as a ready-aligned edge of a mask. Then, for a mask arranged in the upper trench region, the result is a lower demand for accuracy in terms of its extent in the direction of the relief depth. If, in accordance with the process according to the invention, a covering layer is now arranged in an upper trench region, then an oxidation process of a material forming a trench wall in the lower trench region is controlled and then the covering layer is removed, the result is a particularly simple process for arranging an oxide layer as a covering layer in a lower trench region of a trench formed in a substrate. On the other hand, forming an oxide layer as a covering layer in the upper trench region results in a particularly simple process for producing an oxide layer in the upper trench region of a trench formed in a substrate.

Referring now to the figures, FIG. 1A to FIG. 1E depict successive phases of the patterning of a trench wall 43 of a trench 4 which has been formed in a substrate 1 in accordance with the invention. A substrate 1, including a semiconductor substrate 11 and an auxiliary layer 12 arranged on the semiconductor substrate 11, has a horizontal substrate surface 101, from which a trench 4 extends into the substrate 1 in a direction which is vertical with respect to the substrate surface 101, as far as a relief depth 103. The trench wall 43 forms process surfaces 2 which are vertical with respect to the substrate surface 101. A coverage depth 102 down to which or beyond which the relief formed by the trench 4 is to be covered with a covering layer 3 which is subsequently to be formed is predetermined between the substrate surface 101 and the relief depth 103. The coverage depth 102 divides the trench 4 into an upper trench region 41, which is oriented with respect to the substrate surface 101, and a lower trench region 42. Corresponding to the trench regions 41, 42, upper sections 21 of the process surface 2 are arranged between the substrate surface 101 and the coverage depth 102, and lower sections 22 of the process surface 2 are arranged between the coverage depth 102 and the relief depth 103.

Figure 1A:
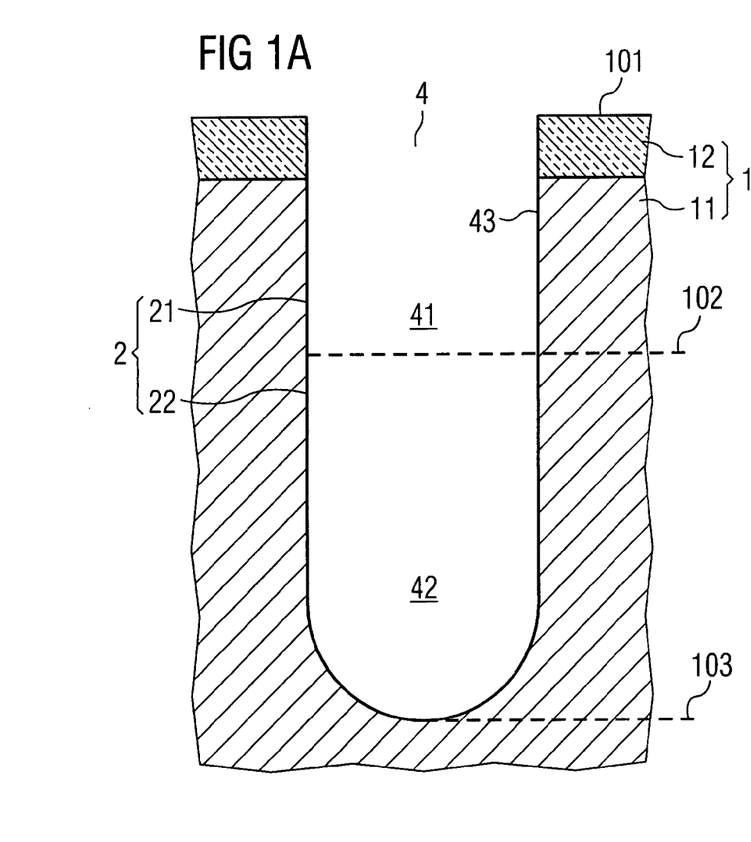
FIGS. 1A-1E depict diagrammatic cross sections through an excerpt of a substrate during a first exemplary embodiment of the process according to the invention.

In accordance with the process according to the invention, a covering layer 3 is produced on the substrate surface 101 and the upper sections 21 of the process surfaces 2. On account of the high sticking coefficient of at least one of the precursor materials, the covering layer 3, starting from the substrate surface 101, grows in the direction of the relief depth 103. This is true of each molecular partial monolayer. The growth of the covering layer 3 in the direction of the relief depth 103 is restricted. For this purpose, by way of example, a process quantity of the precursor material with a high sticking coefficient is restricted, so that the covering layer 3, per monolayer, does not grow any further than the coverage depth 102. Moreover, for each monolayer of the covering layer 3, the deposition process is interrupted when the coverage depth 102 is reached.

Figure 1B:
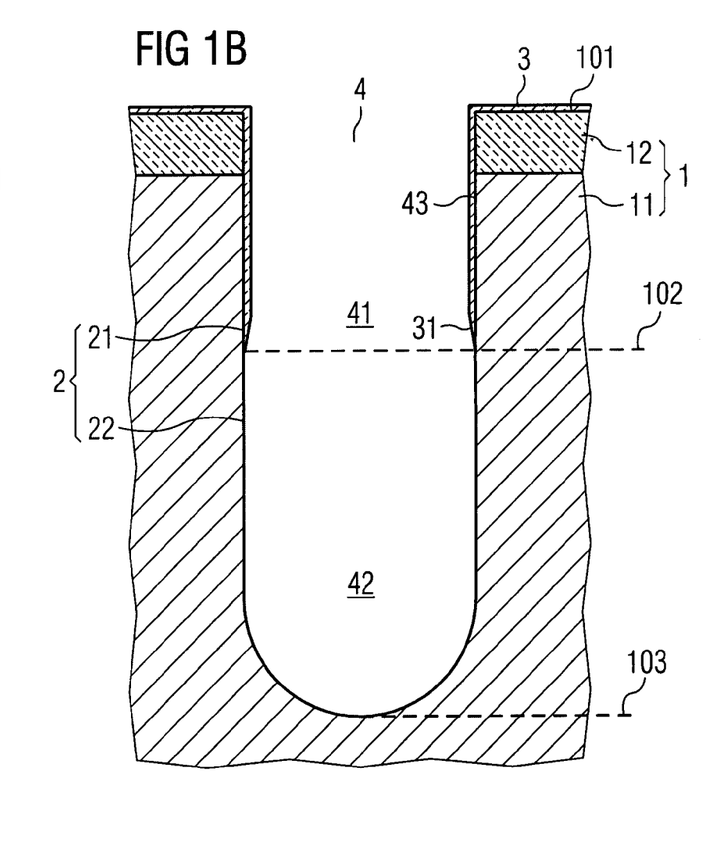

In both cases, the result is the covering layer 3 being formed in the manner illustrated in FIG. 1B. The covering layer 3 extends, apart from a short, wedge-shaped transition region 31, uniformly above the coverage depth 102 in a constant layer thickness. There is scarcely any deposition below the coverage depth 102.

Figure 1C:
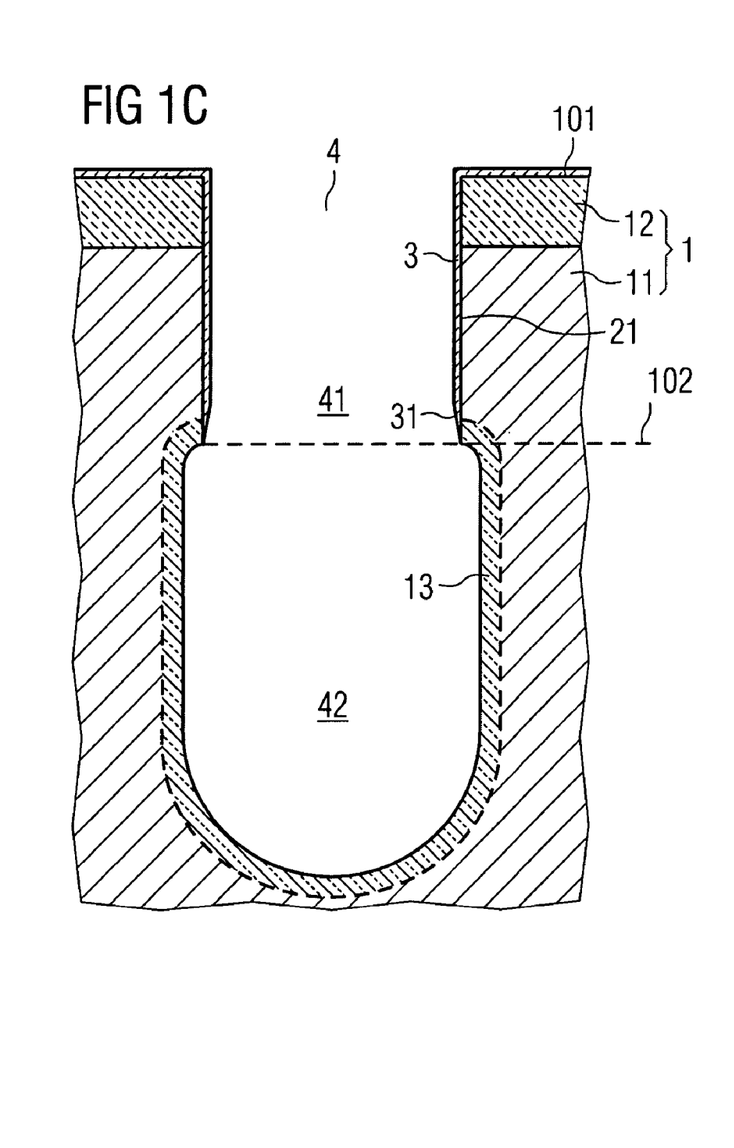

As can be seen from FIG. 1C, in subsequent process steps the covering layer 3 functions as an etching and doping mask. In accordance with FIG. 1C, first of all an etch (bottle etch) takes place in the lower trench region 42. On account of the etching process, the trench 4 is widened in the lower trench region 42.

Figure 1D:
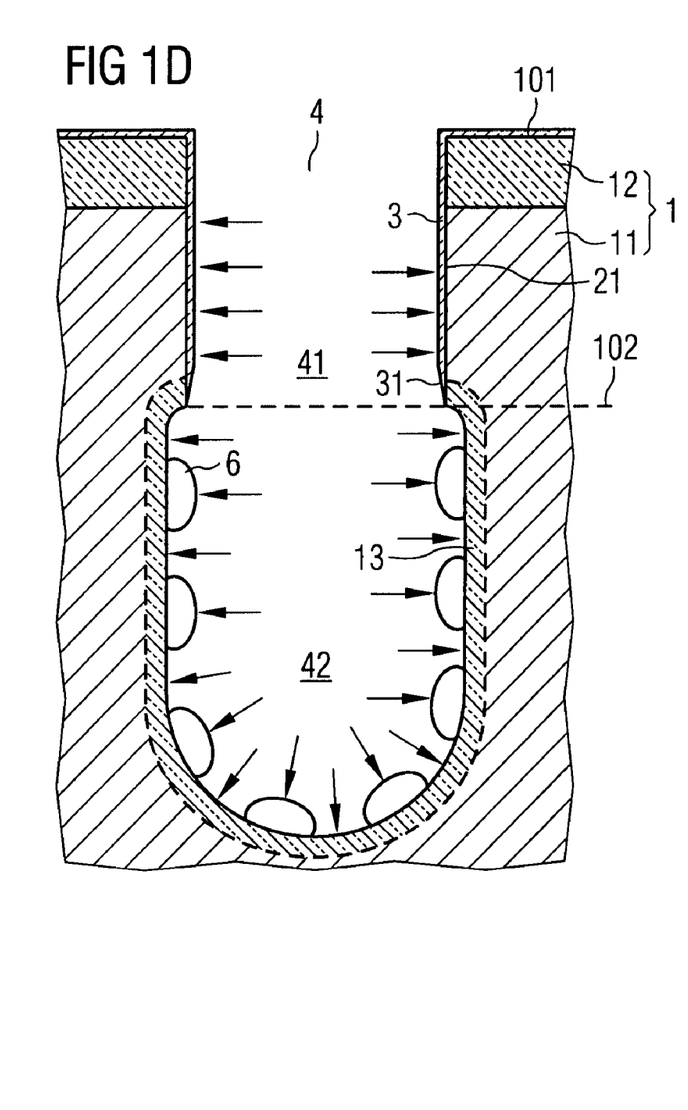
Figure 1E:
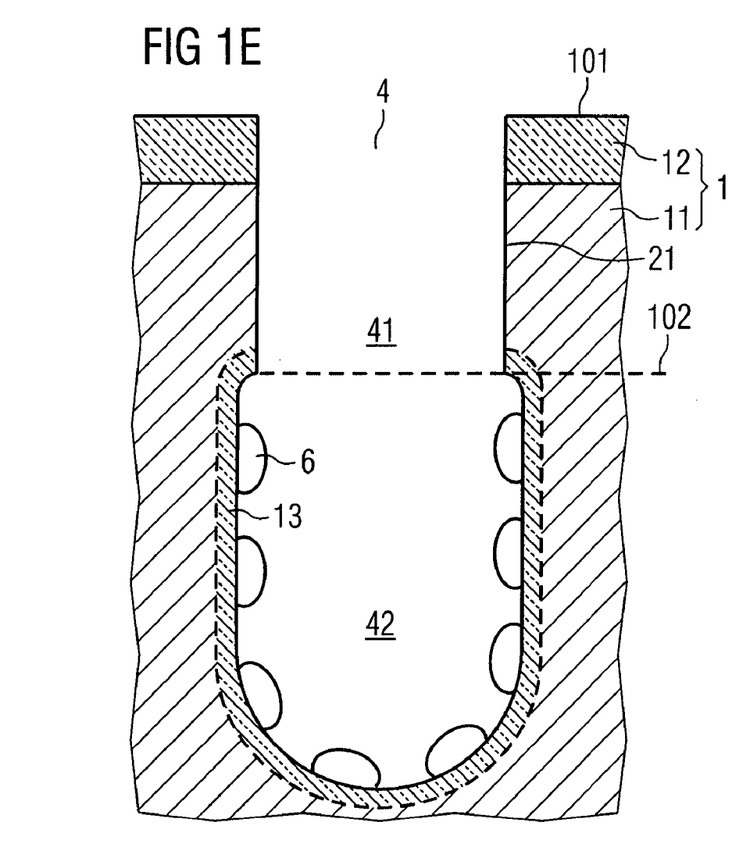

This is followed by gas phase doping, diagrammatically depicted in FIG. 1D, of a region 13 of the semiconductor substrate 11 after preceding HSG (hemispherical silicon grain) deposition of HSG structures 6, optionally followed by etching back. The doped region 13 produced in this way, in the application for the fabrication of DT (deep trench) DRAM memory cells, corresponds to a low-resistance terminal of an, outer electrode (buried plate).

Then, the covering layer 3 which is used as a mask in the preceding process steps is removed. The result is a relief illustrated in FIG. 1E, which has been patterned in a direction which is vertical with respect to the substrate surface 101 by an etching step acting only on the lower trench region 42 and a doping step, likewise acting only on the lower trench region 42.

Figure 2A:
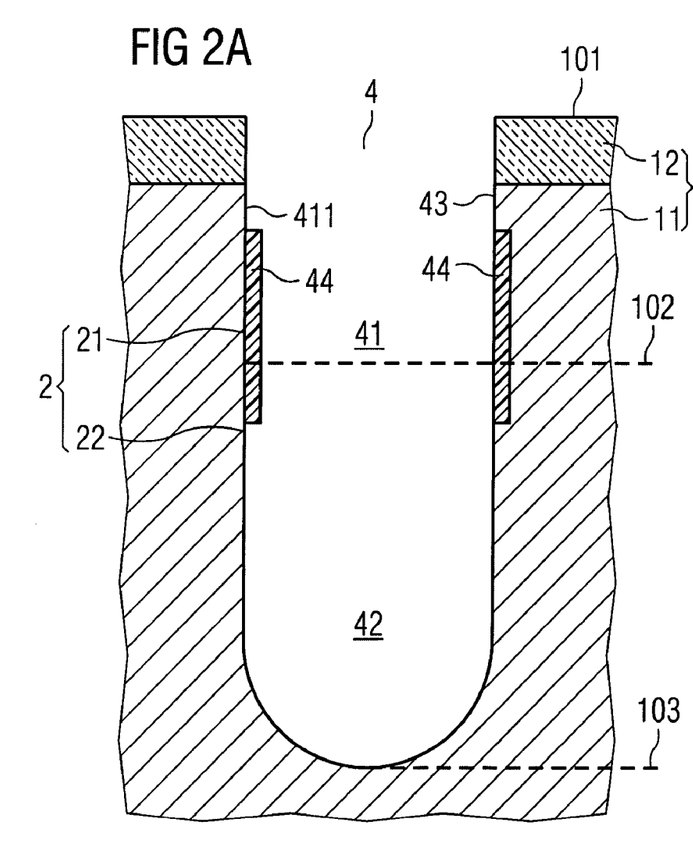
FIGS. 2A-2C depict diagrammatic cross sections through an excerpt of a substrate during a second exemplary embodiment of the process according to the invention.
Figure 2B:
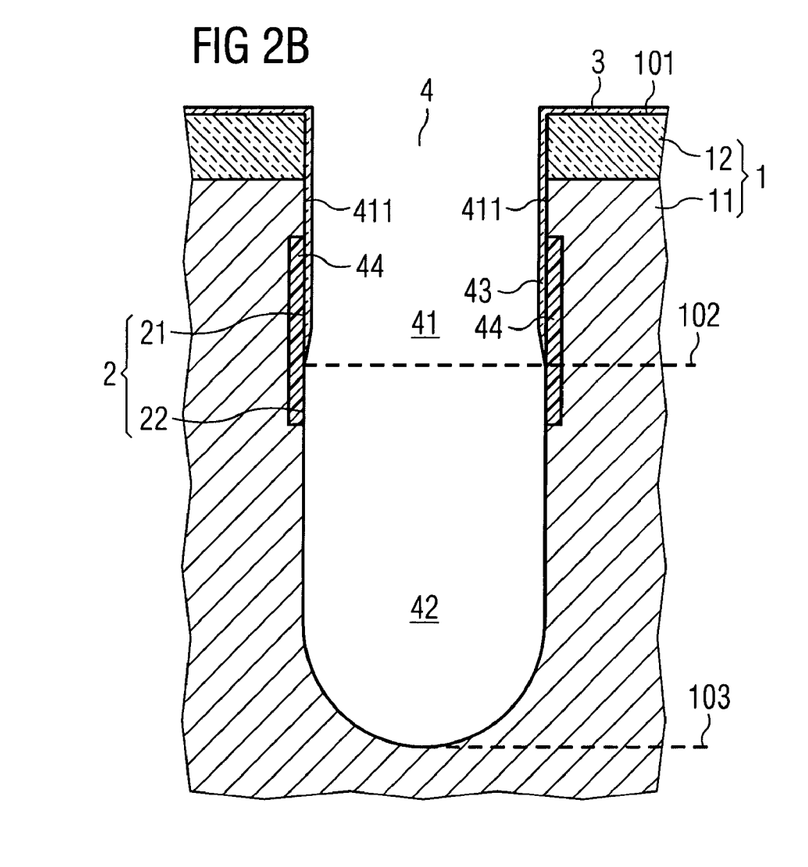
Figure 2C:
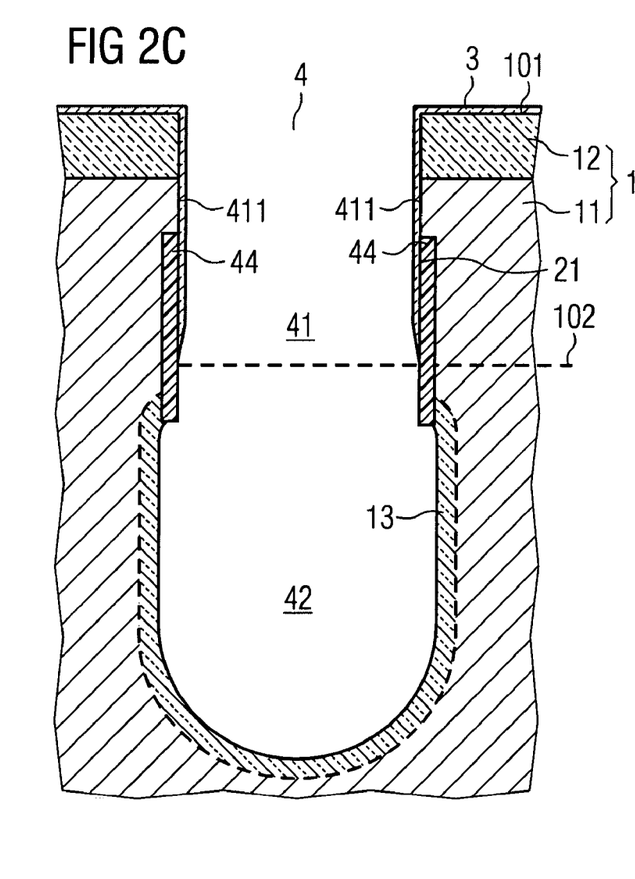

FIG. 2A to FIG. 2C illustrate a further exemplary embodiment of patterning of a trench 4. Unlike the trench shown in FIG. 1, the trench 4 shown in FIG. 2 has a collar 44 which is arranged in the upper trench region 41, is embedded in the semiconductor substrate 11 and surrounds the trench 4.

FIG. 2A illustrates a trench 4 which has been introduced into a substrate 1 from a substrate surface 101 down to a relief depth 103 and has a collar 44 in the upper trench region 41. For subsequent process steps, partial sections 411 of the trench wall 43 between the substrate surface 101 and a top edge of the collar 44 are to be masked.

Then, an incomplete covering layer 3 (inconformal liner) is produced, covering the trench wall 43 only down to a coverage depth 102. For subsequent etching and doping steps, both the covering layer 3 and the collar 44 function as a mask. The process according to the invention is particularly suitable for this example, since an accurate position of the top edge of an etching and doping operation has already been defined by a bottom edge of the collar 44. The covering layer 5 only covers a partial section 411, located between the substrate surface 101 and an upper edge of the collar 44, of the trench wall 43 in the upper trench region 41. There is no need for precise vertical alignment of the coverage depth 102 by means of the deposition process, provided that it is ensured that the covering layer 3 ends in the region of the collar 44. After a bottle etch and subsequent gas phase doping, the covering layer 3 is removed, a dielectric layer (node dielectric) is produced on the trench wall 43 and then the trench 4 is filled with polysilicon.

Figure 3A:
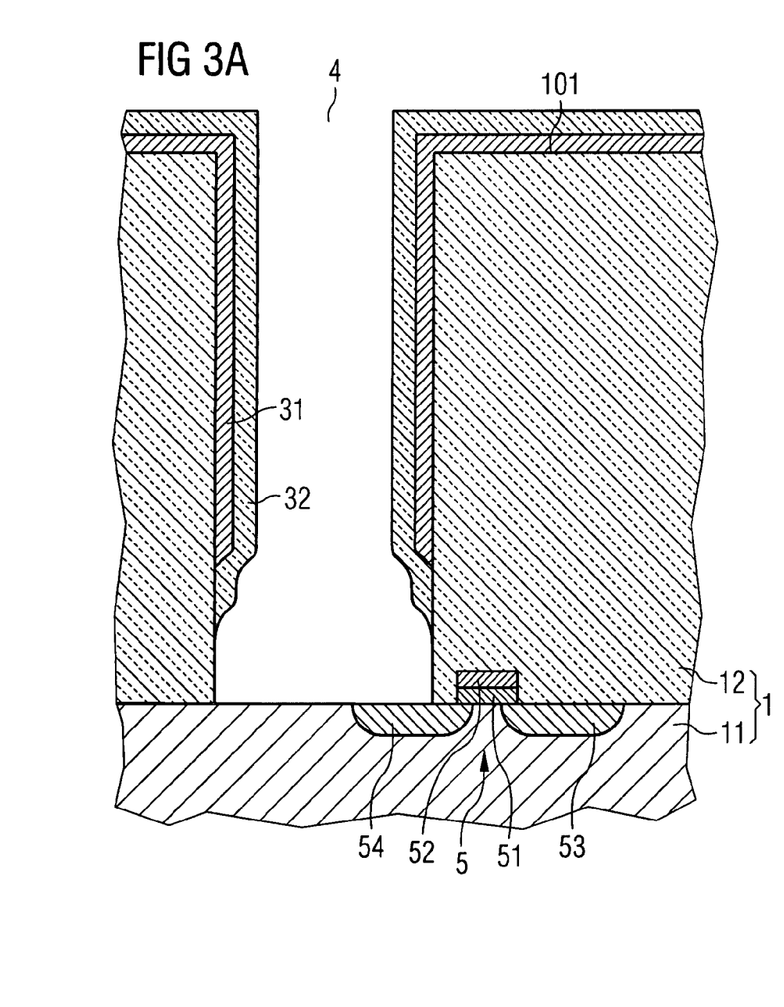
FIGS. 3A-3C depict diagrammatic cross sections through an excerpt of a substrate during a third exemplary embodiment of the process according to the invention.
Figure 3B:
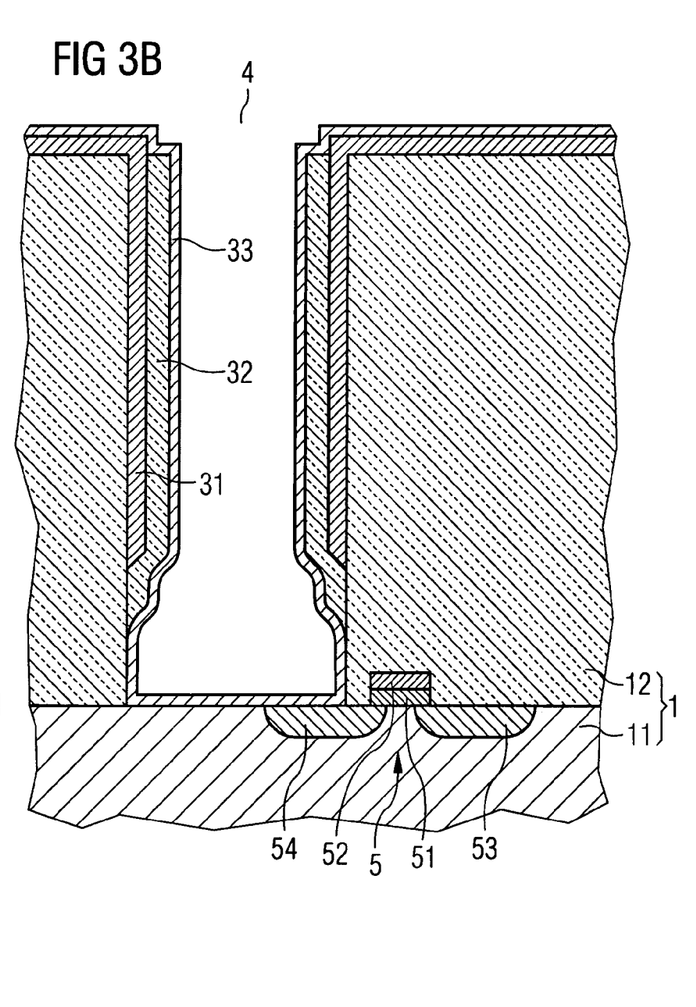
Figure 3C:
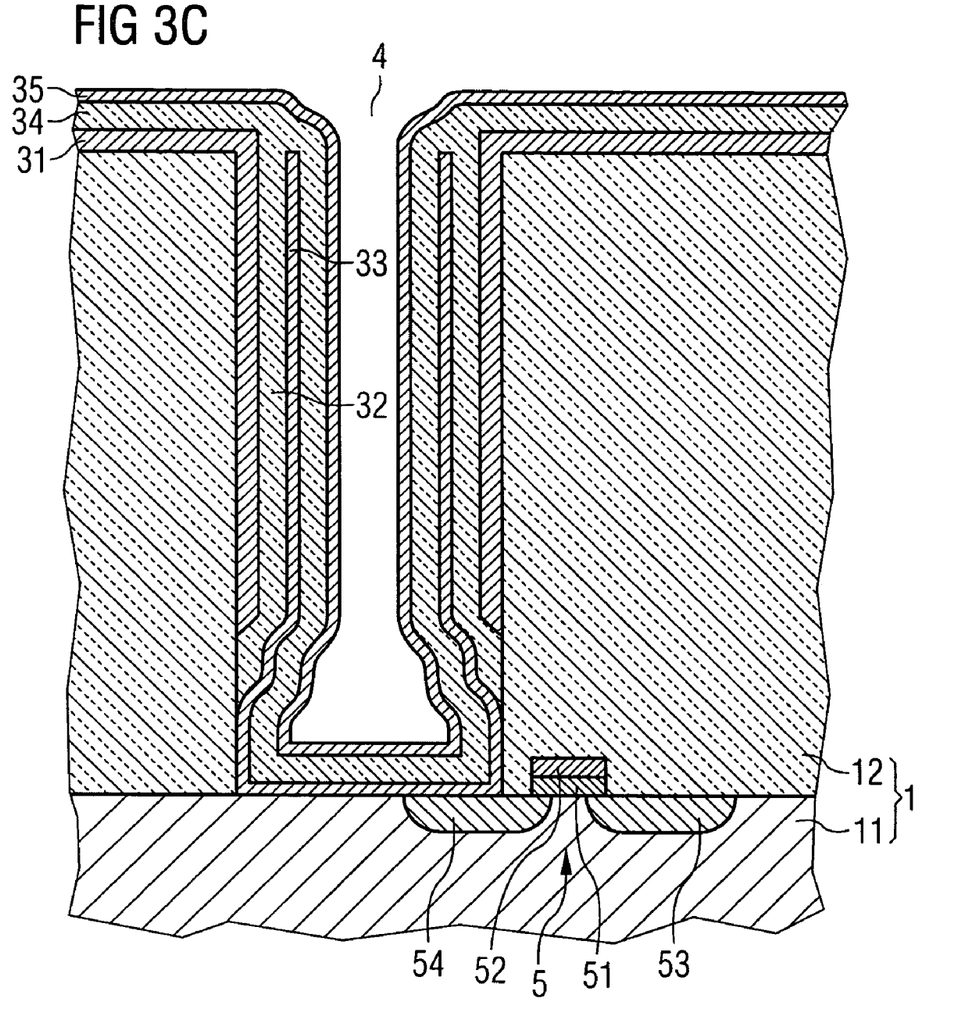

FIGS. 3A to 3C illustrate, as a further exemplary embodiment of the process according to the invention, various phases of the process of arranging electrodes and a dielectric as part of the processing of stacked capacitors.

In this embodiment, first of all electronic structures, such as for example transistors 5, are formed in and on the semiconductor substrate 11, each having a gate dielectric 51, a gate electrode 52 as well as doped regions 53, 54 which form a drain electrode and a source electrode. The stacked capacitors, unlike the trench capacitors shown in FIG. 1, are provided on or above the surface of the semiconductor substrate 11. For this purpose, first of all an auxiliary layer 12, for example of silicon dioxide, is applied to the semiconductor substrate 11. The semiconductor substrate 11, together with the auxiliary layer 12, forms a substrate 1 into which trenches 4 are introduced from a substrate surface 101.

Next, using the process according to the invention for the deposition of an inconformal covering layer, an inconformal, conductive covering layer 31 and an inconformal dielectric covering layer 32 are produced in succession. The inconformal dielectric covering layer 32 is drawn deeper into the trench than the inconformal conductive covering layer 31. The resulting arrangement is diagrammatically depicted in FIG. 3A.

Then, the inconformal dielectric covering layer 32 is etched back approximately as far as the top edge of the trench 4 (spacer etch), and a conformal conductive covering layer 33, for example of doped polysilicon, is applied. FIG. 3B shows the resulting arrangement. By means of the conformal conductive covering layer 33, the stacked capacitor is electrically connected to the doped region 54 of the transistor 5.

In further steps, first of all the conformal conductive covering layer 33 is etched back approximately as far as the upper edge of the trench 4, and then a conformal dielectric covering layer 34 and a second conformal conductive covering layer 35 are deposited. This results in the arrangement illustrated in FIG. 3C.

The first conformal conductive covering layer 33 forms a first electrode (node electrode), which is connected to a doped region 54 of the transistor 5, of the stacked capacitor formed in the trench 4. The inconformally deposited conductive covering layer 31 and the second, conformally deposited conductive covering layer 35 form an outer and an inner counterelectrode, which are insulated from the first electrode 33 by the inconformally and conformally, respectively, deposited dielectric covering layers 32, 34.

The process according to the invention for depositing an inconformal covering layer results in a very significant simplification to the process flow. Compared to the production of the structure illustrated in FIG. 3C by conventional means, there is no need for a multistage process sequence comprising the deposition of a filling material, etching back of the filling material and complete removal of the filling material for the two inconformally deposited covering layers.

Figure 4A:
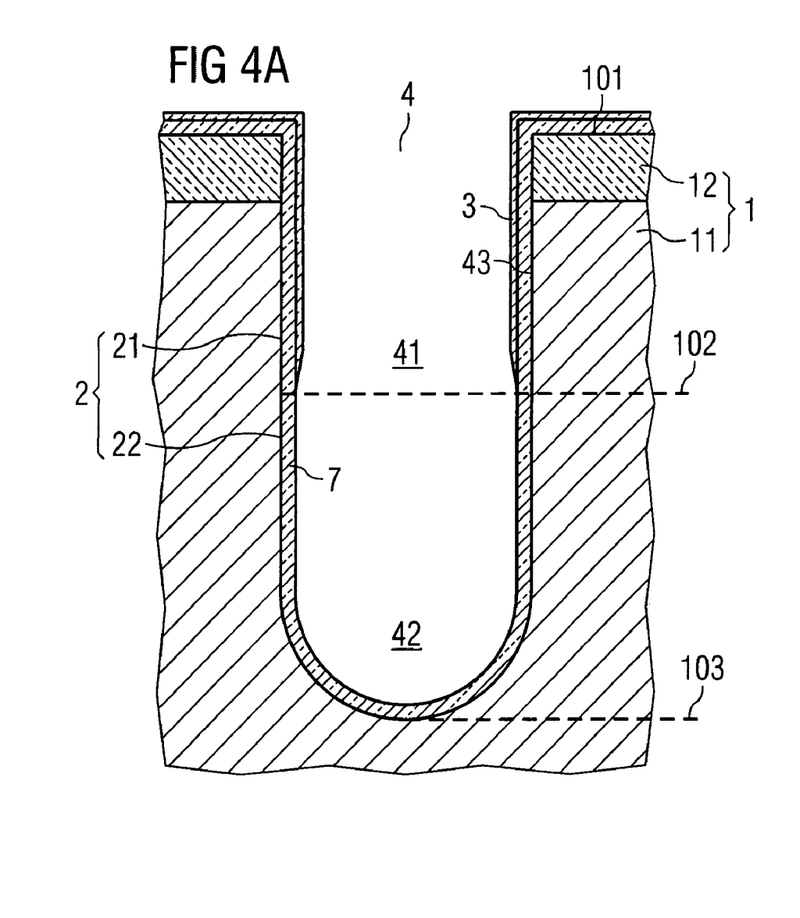
FIG. 4A-4C depict diagrammatic cross sections through an excerpt of a substrate during a fourth exemplary embodiment of the process according to the invention.
Figure 4B:
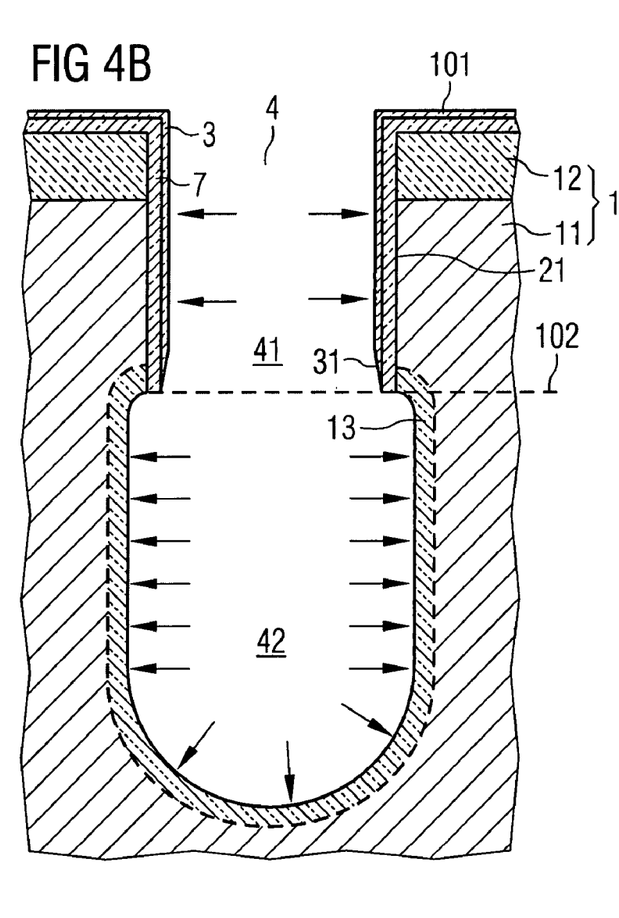
Figure 4C:
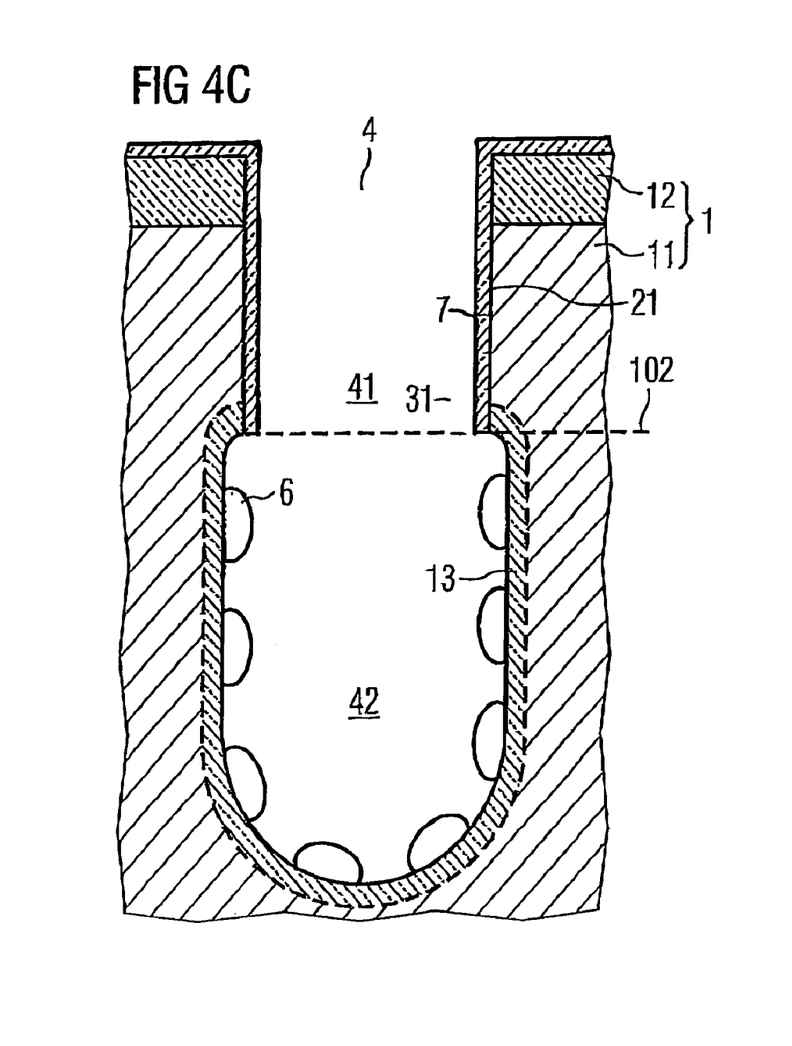

FIGS. 4A to 4C illustrate a variant of the exemplary embodiment of the process according to the invention illustrated in FIGS. 1A to 1E. In this case, prior to the deposition of the inconformal covering layer 3 on the substrate 1, a conformal additional layer 7, for example of silicon nitride or silicon oxide, is provided by deposition or by oxidation or nitriding.

FIG. 4A illustrates the additional layer 7 which lines the trench 4 and on which an inconformal covering layer 3 which has been deposited down to a coverage depth 102 in accordance with the invention is arranged.

Then, the additional layer 7 is removed below the coverage depth 102 and the trench 4 is widened by etching (wet bottle etch) in a trench region 42 arranged beneath the coverage depth 102. Then, a gas phase doping operation is carried out, masked by the inconformally deposited covering layer 3.

This results in the structure illustrated in FIG. 4B, in which the trench 4 is lined with an additional layer 7 and the inconformal covering layer 3 on top of it in an upper trench region 41 above the coverage depth 102. The semiconductor substrate 11 is doped in regions 13 which adjoin the lower trench region 42.

Then, the inconformal covering layer 3 is removed and HSG forming with subsequent etching back is carried out, resulting in the structure illustrated in FIG. 4C. In the upper trench region 41, the trench 4 is lined with the additional layer 7, while in the lower trench region 42 it has HSG structures 6. Then, the additional layer 7 is removed and a dielectric deposited.

Unlike in the process illustrated with reference to FIG. 1, the HSG forming in accordance with the process illustrated in FIG. 4 is only carried out after the removal of the inconformal covering layer. This avoids forming of HSG structures on the inconformal covering layer, a high level of which is observed, for example, when $Al_2O_3$ is selected as material for the covering layer 3.

Figure 5:
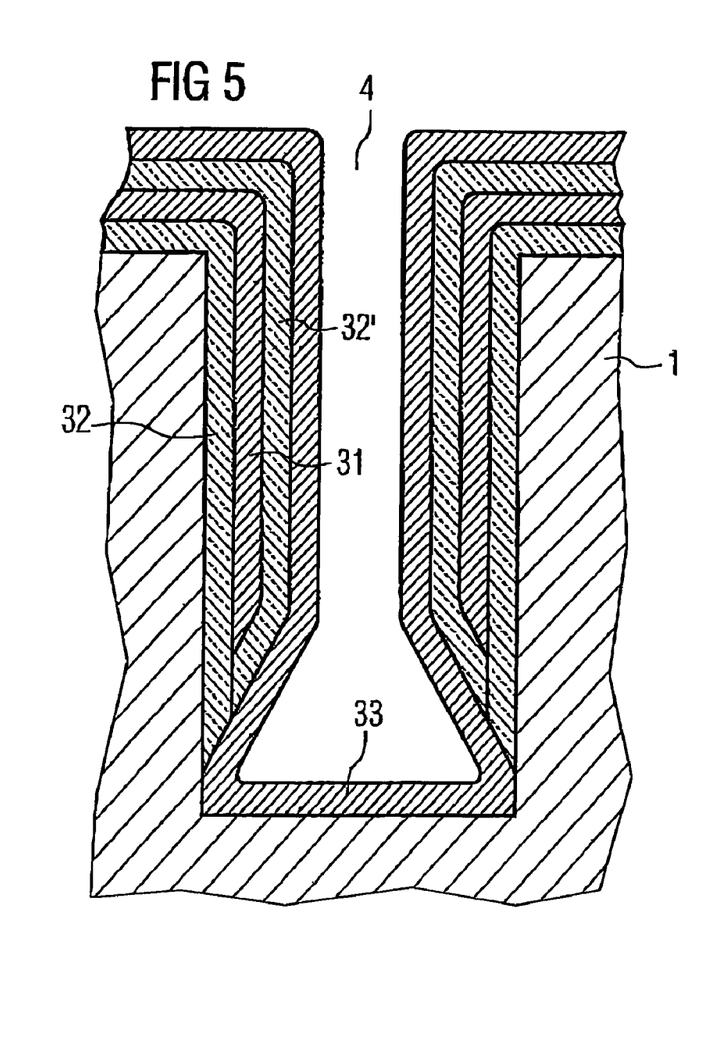
FIG. 5 depicts a diagrammatic cross section through a capacitor structure produced in accordance with the invention.

FIG. 5 shows a capacitor structure arranged in a substrate 1. The capacitor structure illustrated can be produced by repeated deposition of inconformal covering layers in accordance with the invention. A capacitor based on the capacitor structure has a high degree of reliability, a low leakage current and a high specific capacitance in relation to the volume. With the capacitor structure shown, it is possible for a capacitor of high specific capacitance to be produced simply and inexpensively using two or more electrodes which have been formed in comb style in a trench with the aid of the process according to the invention.

For this purpose, first of all trenches 4 with a high aspect ratio are introduced into a substrate 1 by dry etching or by means of macropores. The trenches 4 have a longitudinal extent which is perpendicular to the cross-sectional plane of the illustration. A capacitor structure in this case extends over one or more trenches 4 arranged parallel next to one another.

Then, functional silicon structures, including, for example, for the connection of electrodes of the capacitor structure, provided in the substrate 1 are doped.

This is followed by the deposition of a first inconformal dielectric covering layer 32 and of an inconformal conductive covering layer 31. In the process, the inconformal conductive covering layer 31 is provided in shortened form compared to the first, inconformal dielectric covering layer 32 arranged beneath it. A second inconformal dielectric covering layer 32' is provided in such a way that it completely covers the inconformal conductive covering layer 31 which forms an outer electrode and adjoins the first inconformally deposited dielectric covering layer 32.

Finally, a conformally deposited conductive covering layer 33 is provided as an inner electrode. Contact is made with the inner electrode by means of a doped region of the substrate 1 or, for example, by patterning the deposited covering layers at the surface of the substrate 1. To increase the capacitance, the capacitor structure is prepared for the abovementioned deposition steps to be repeated, so that given a sufficient trench width the partial structure of the covering layers shown in FIG. 5 can be repeated inside a trench 4. In this case, advantageously all the respective inner electrodes 33 are conductively connected at the base of the trench without further measures. If the conformally deposited conductive covering layer 33 and the dielectric covering layers 32 are etched back in a suitable way, the result, likewise without further measures, is a conductive connection between the respective outer electrodes 31 of the recurring partial structures.

EXAMPLE 1

During the processing of vertical transistor structures, such as trench power transistors and IGBTs (isolated gate bipolar transistors), the doping of a drain zone is advantageously simplified by a covering layer which is deposited inconformally in accordance with the invention and acts as a doping barrier. For this purpose, trenches, in each of which a gate electrode will be provided in the subsequent process sequence, are first introduced into a substrate. In an upper region, which in the finished structure lies opposite source and channel zones formed in the substrate, the trenches are lined with a doping barrier which has been deposited inconformally in accordance with the invention. Then, the drain zone, adjacent to a lower region of the trenches, of the substrate is doped and then the doping barrier is removed.

EXAMPLE 2

An increasing integration density in integrated circuits means that it is necessary, during the processing of these circuits, to provide through-contacts leading to structures in a deep layer arranged beneath an upper layer, from a substrate surface through an upper layer with conductive regions which have already been formed. The conductive regions are in this case doped semiconductor regions or metallizations. For this purpose, an opening (channel) is etched into the substrate as far as the lower layer and is then filled with a conductive material.

If, on account of manufacturing tolerances during the formation of the openings, sections of the conductive regions of the upper layer are uncovered by an opening and then the opening is filled with a conductive material, the result is a generally unintended electrical connection between the conductive regions of the upper layer and the deep layer.

Now, in accordance with the invention, after the openings have been formed and before they are filled, an inconformal, dielectric covering layer is provided on a wall of the opening in an upper region of the channel, covering any uncovered sections of conductive regions of the upper layer. A base of the opening, in the region of which contact is made with the conductive region of the deep layer, remains uncovered. An undesirable electrical short circuit between the two conductive regions is avoided.

A typical example of an application of this type for the process according to the invention is for stacked capacitor structures. In the case of a stacked capacitor structure, a transistor structure is arranged along a deep layer between a semiconductor substrate and an oxide layer on top of it, in which capacitor structures and signal lines (bit lines) are formed, and contact has to be made with this transistor structure from a substrate surface through the oxide layer. During the etching of openings for the through-contacts, the signal lines may be uncovered with respect to an opening. As a result of the openings being lined in a region extended as far as below the signal lines by an inconformal dielectric covering layer using the process according to the invention, the yield of defect-free structures without any short circuits with respect to the signal lines is considerably increased.

While the invention has been described in detail and with reference to specific embodiments thereof, it is believed that other modifications, variations and changes will be suggested to those skilled in the art in view of the teachings set forth herein. It is therefore to be understood that all such variations, modifications and changes are believed to fall within the scope of the present invention as defined by the appended claims and their equivalents.

LIST OF REFERENCE SYMBOLS

1 Substrate
101 Substrate surface
102 Coverage depth
103 Relief depth
11 Semiconductor substrate
12 Auxiliary layer
13 Doped region
2 Process surface
21 Upper section
22 Lower section
3 Covering layer
31 Conductive inconformal covering layer
32, 32' Dielectric inconformal covering layer
33 Conductive conformal covering layer
34 Dielectric conformal covering layer
35 Second conductive conformal covering layer
4 Trench
41 Upper trench region
411 Partial section
42 Lower trench region
43 Trench wall
44 Collar
5 Transistor
51 Gate dielectric
52 Gate electrode
53 Doped region
54 Doped region
6 HSG structure
7 Additional layer

What is claimed is:

1. A process for patterning process surfaces of a substrate with a relief, the process surfaces being disposed within trenches and further being vertical and/or inclined with respect to a horizontal substrate surface and extending from the substrate surface down to a relief depth, wherein a coverage depth for each trench is defined at a selected location between the substrate surface and the relief depth for the trench, the method comprising:

produdcing a covering layer via an ALD deposition process in a process chamber, the covering layer being built up from the substrate surface, in a direction of the relief depth, from precursor materials, wherein the covering layer is deposited on upper sections of the process surfaces disposed between the substrate surface and the coverage depth, with a thickness of the covering layer being substantially uniform until the covering layer reaches a transition region defined proximate the coverage depth, and the covering layer is further restricted from completely covering the process surfaces by providing suitable parameters of the deposition process such that substantially no deposition of the covering layer occurs between the coverage depth and the relief depth.

2. The process of claim 1, wherein the deposition process is controlled such that least one of the precursor materials is selected to have a high sticking coefficient, absorbed molecules of the precursor material with the high sticking coefficient are substantially prevented from being desorbed, and the covering layer is built up with diffusion control from the substrate surface toward the relief depth.

3. The process of claim 1, wherein the coverage depth is determined based upon an exposure that results from a product of a concentration of one of the precursor materials, a deposition time for the precursor materials and a process pressure in the process chamber during the deposition.

4. The process of claim 1, wherein the deposition of at least one of the precursor materials is limited by supplying a reduced quantity of precursor material in comparison to a quantity of precursor material that is required for complete coverage of the process surfaces from the substrate surface to the relief depth.

5. The process as recited in claim 4, wherein the at least one precursor material is supplied by means of liquid injection.

6. The process of claim 1, wherein the deposition of at least one of the precursor materials is restricted by reducing a deposition time for the precursor material compared to a deposition time required for complete coverage of the process surfaces from the substrate surface to the relief depth.

7. The process of claim 1, wherein the deposition of at least one of the precursor materials is restricted by reducing a chamber pressure in the process chamber compared to a chamber pressure required for complete coverage of the process surfaces from the substrate surface to the relief depth.

8. The process of claim 1, wherein each precursor material is distributed uniformly over the substrate surface via a distribution device.

9. The process of claim 1, wherein the covering layer includes a material that has a higher etching resistance with respect to a material that forms the process surfaces in lower sections disposed between the relief depth and the coverage depth, the material which forms the process surfaces in the lower sections is etched with high selectivity compared to the covering layer, and in the process the etching is masked at least in sections by the covering layer.

10. The process of claim 1, wherein the covering layer includes a material that is substantially inert with respect to an oxidation process, a material which forms the process surfaces in lower sections arranged between the relief depth and the coverage depth is oxidized by means of the oxidation process and the oxidation process is masked at least in sections by the covering layer.

11. The process of claim 1, wherein the covering layer includes a material that is suitable as a baffler against a doping process, and a material which forms the process surfaces in lower sections arranged between the relief depth and the coverage depth is doped by means of the doping process and the doping process is masked at least in sections by the covering layer.

12. The process of claim 1, wherein the covering layer is removed after it has been used as at least part of a mask.

13. The process of claim 1, wherein, prior to the deposition of the covering layer, at least one additional layer is provided on the substrate, and the covering layer is provided at least on sections of the additional layer.

14. The process of claim 13, wherein the additional layer comprises silicon oxide or silicon nitride.

15. The process of claim 1, wherein the covering layer comprises a material selected from the group consisting of $Al_2O$, $HfO_2$, $ZrO_2$, $TiO_2$, TiN, WN, SiN, $SiO_2$ and $LaO_2$.

16. The process of claim 15, wherein the covering layer comprises $Al_2O_3$, trimethyl aluminum is utilized as a first precursor material to produce the covering layer, and $H_2O$ and/or $O_3$ is utilized as a second precursor material to produce the covering layer.

17. The process of claim 15, wherein the covering layer comprises $HfO_2$, one of $HfCl_4$, Hf-t-butoxide, Hf-di-methylamide, Hf-ethylmethylamide, Hf-di-ethylamide and $Hf(MMP)_4$ is utilized as a first precursor material to produce the covering layer, and $H_2O$ and/or $O_3$ is utilized as a second precursor material to produce the covering layer.

18. The process of claim 15, wherein the covering layer comprises $ZrO_2$, one of $ZrCl_4$ and an organic Zr compound is utilized as a first precursor material to produce the covering layer, and $H_2O$ and/or $O_3$ is utilized as a second precursor material to produce the covering layer.

19. The process of claim 15, wherein the covering layer comprises $TiO_2$, one of $TiCl_4$, $Ti(OC_2H_5)_4$ and $Ti(OCH(CH_3)_2)_4$ is utilized as a first precursor material to produce the covering layer, and $H_2O$ and/or $O_3$ is utilized as a second precursor material to produce the covering layer.

20. The process of claim 15, wherein the covering layer comprises TiN, $TiCl_4$ is utilized as a first precursor material to produce the covering layer, and $NH_3$ is utilized as second precursor material to produce the covering layer.

21. The process of claim 15, wherein the covering layer comprises WN, $WF_6$ is utilized as a first precursor material to produce the covering layer, and $NH_3$ is utilized as second precursor material to produce the covering layer.

22. The process of claim 15, wherein the covering layer comprises SiN, $SiH_2Cl_2$ is utilized as a first precursor material to produce the covering layer, and $NH_3$ and/or $N_2H_4$ is utilized as second precursor material to produce the covering layer.

23. The process of claim 15, wherein the covering layer comprises $SiO_2$, $Si(NCO)_4$ or $CH_3OSi(NCO)_3$ is utilized as a first precursor material to produce the covering layer, and $H_2O$ and/or $O_3$ is utilized as second precursor material to produce the covering layer.

24. The process of claim 1, wherein trenches with a high aspect ratio are formed in the substrate for the relief.

25. The process of claim 24, wherein the trenches are formed into capacitors.

26. A process for arranging an oxide layer in a lower trench region of a trench formed in a substrate, comprising:

forming a covering layer in an upper trench region using the process of claim 1, the upper trench region being defined between the substrate surface and the coverage depth;

oxidizing a material to form a trench wall in the lower trench region, the lower trench region defined between the coverage depth and the relief depth; and removing the covering layer.

27. A process for arranging an oxide layer in an upper trench region of a trench formed in a substrate by forming the oxide layer as a covering layer in an upper trench region using the process of claim 1, wherein the upper trench region is defined between the substrate surface and the coverage depth.

28. A process for producing a capacitor structure in a substrate, comprising the steps of:

(a) providing the substrate;

(b) introducing trenches into the substrate;

(c) depositing a first dielectric covering layer in the trenches using the process of claim 1;

(d) depositing a conductive covering layer in the trenches, which does not completely cover the first dielectric covering layer, using the process of claim 1;

(e) depositing a second dielectric covering layer in the trenches, which completely covers the conductive covering layer, using the process of claim 1; and (f) depositing a conformal conductive covering layer in the trenches.

29. The process of claim 28, further comprising:

(g) repeating steps (c) through (f) at least once.

30. The process of claim 1, wherein the restriction of the covering layer completely covering the process surfaces during the deposition process is achieved without providing any material between the coverage depth and the relief depth.

* * * * *